US008559905B2

(12) United States Patent
Buer et al.

(10) Patent No.: US 8,559,905 B2
(45) Date of Patent: Oct. 15, 2013

(54) SYSTEMS, DEVICES, AND METHODS FOR SUPPRESSING FREQUENCY SPURS IN MIXERS

(75) Inventors: Kenneth V. Buer, Gilbert, AZ (US);
Gaurav Menon, Gilbert, AZ (US);
Ramanamurthy V. Darapu, Gilbert, AZ (US); Dean Muellenberg, Tempe, AZ (US)

(73) Assignee: ViaSat, Inc., Carlsbad, CA (US)

( * ) Notice: Subject to any disclaimer, the term of this patent is extended or adjusted under 35 U.S.C. 154(b) by 626 days.

(21) Appl. No.: 11/950,831

(22) Filed: Dec. 5, 2007

(65) Prior Publication Data
US 2009/0149150 A1    Jun. 11, 2009

(51) Int. Cl.
*H04B 1/10* (2006.01)
*H04K 3/00* (2006.01)

(52) U.S. Cl.
USPC .................. 455/310; 455/114.1; 455/317

(58) Field of Classification Search
USPC .......................... 455/310, 317, 326
See application file for complete search history.

(56) References Cited

U.S. PATENT DOCUMENTS

| 4,961,074 | A |   | 10/1990 | Martinson |
| 5,127,102 | A |   | 6/1992 | Russell |
| 5,414,313 | A | * | 5/1995 | Crescenzi et al. ............ 327/351 |
| 5,446,923 | A |   | 8/1995 | Martinson et al. |
| 6,072,352 | A |   | 6/2000 | Mcnamara et al. |
| 6,393,260 | B1 | * | 5/2002 | Murtojarvi et al. ............. 455/91 |
| 6,693,578 | B1 | * | 2/2004 | Martinson ....................... 342/20 |
| 2005/0191985 | A1 | * | 9/2005 | Bos et al. ....................... 455/326 |
| 2005/0264443 | A1 |   | 12/2005 | Kashiwa et al. |

FOREIGN PATENT DOCUMENTS

| EP | 1605585 |   | 12/2005 |
| JP | 9238027 |   | 9/1997 |
| JP | 2001308647 | * | 11/2001 |
| JP | 2007235368 |   | 9/2007 |
| WO | 2007093814 |   | 8/2007 |

OTHER PUBLICATIONS

PCT International Search Report and Written Opinion dated Jan. 14, 2009 for PCT/US2008/083918.
International Preliminary Report on Patentability from corresponding PCT Application No. PCT/US08/083918 dated Jun. 17, 2010.
Office Action dated Mar. 20, 2012 in Chinese Application No. 200880119661.9.
Search Report dated May 8, 2012 in European Application No. 08856789.6.
Office Action mailed Feb. 6, 2013 in counterpart Chinese Application No. 200880119661.9.

* cited by examiner

*Primary Examiner* — Lee Nguyen
(74) *Attorney, Agent, or Firm* — Snell & Wilmer L.L.P.

(57) ABSTRACT

Systems, devices and methods are disclosed for suppressing the 2LO frequency spur, output from a mixer. In various exemplary embodiments, a DC bias circuit is electrically connected to provide DC bias to one or more non-linear elements of the mixer. The biasing voltage is used to cause the current-voltage characteristics and/or junction capacitances between non-linear elements to be more symmetric and/or to suppress 2LO leakage currents that form 2LO frequency spurs at the output of the mixer. The non-linear elements may comprise one of: BJT's, diodes, and FET's. The mixer may be one of: a subharmonic mixer; a fundamental resistive mixer; a fundamental subharmonic transconductance mixer; and a fundamental transconductance mixer comprising an anti-parallel diode pair. The system may further be configured to automatically determine an appropriate DC bias voltage level that will improve one of the LO-IF isolation and the LO-RF isolation.

19 Claims, 9 Drawing Sheets

SYSTEMS, DEVICES, AND METHODS FOR SUPPRESSING FREQUENCY SPURS IN MIXERS

FIELD OF INVENTION

The present invention relates to frequency mixers. More particularly, the invention relates to systems, devices and methods for suppressing frequency spurs in fundamental and subharmonic mixers.

BACKGROUND OF THE INVENTION

Frequency mixers combine input signals to produce an output signal. Mixers are frequently used to down-convert a radio frequency (RF) signal to a lower intermediate frequency (IF) signal or up-convert an IF signal to a higher RF signal. Mixers down-convert by mixing an RF signal with a local oscillator (LO) signal. Mixers up-convert by mixing an IF signal with an LO signal.

Mixers can be either fundamental or subharmonic. A fundamental mixer down-converts an RF signal to an IF signal by mixing the RF signal with the fundamental frequency of an LO signal. A fundamental mixer up-converts an IF signal to an RF signal by mixing an IF signal with the fundamental frequency of the LO signal. The fundamental mixer produces a mixed signal that is rich in harmonics. If the fundamental mixer is a down-converter, the mixed signal will have harmonics that are the sums and differences of the harmonics of the RF and LO signals (i.e. $nf_{lo} \pm mf_{rf}$). If the fundamental mixer is an up-converter, the mixed signal will have harmonics that are the sums and differences of the harmonics of the IF and LO signals (i.e. $nf_{lo} \pm mf_{if}$). Generally, the mixed signal is then filtered to produce the RF signal or the IF signal.

A subharmonic mixer operates similar to a fundamental mixer except that the subharmonic mixer mixes an RF signal or an IF signal with a harmonic of the fundamental frequency of the LO signal, usually the $2^{nd}$ harmonic. A subharmonic mixer down-converts an RF signal to an IF signal by mixing the RF signal with a harmonic of the fundamental frequency of the LO signal. This produces a mixed signal having harmonics that are the sum and difference of the harmonics of the RF and LO signals (i.e. $nf_{lo} \pm mf_{rf}$). A subharmonic mixer up-converts an IF signal to an RF signal by mixing an IF signal with a harmonic of the fundamental frequency of the LO signal. This produces a mixed signal having harmonics that are the sum and difference of the harmonics of the IF and LO signals (i.e. $nf_{lo} \pm mf_{if}$). The mixed signal is then filtered to produce the IF signal or the RF signal.

Fundamental mixers are impractical for many very high frequency applications. A fundamental mixer for a high frequency application may require LO signals with a very high fundamental frequency. LO's that produce signals with very high fundamental frequencies are often prohibitively expensive or unavailable. Instead, a subharmonic mixer is frequently used. Subharmonic mixers exploit the harmonics of the LO signal and thus can use LO signals (and thus LO's) having a fundamental frequency much lower than the LO of an equivalent fundamental mixer. This makes the subharmonic mixer a more practical choice than a fundamental mixer for many high frequency applications. Nevertheless, one skilled in the art will recognize that there are trade off's associated with the selection of either a fundamental or subharmonic mixer, and will exercise judgment in determining which type of mixer is most appropriate for a particular application.

Although several types of subharmonic mixers exist, one type of subharmonic mixer features an anti-parallel diode pair. In an exemplary down-converter (up-converter) mixer the RF (IF) signal may be fed into one end of the anti-parallel diode pair and the LO signal into the other end of the anti-parallel diode pair. The anti-parallel diode pair forms a current conduction loop. The conduction loop is tapped to extract a mixed signal. Typically, the LO signal dominates, therefore generally when the LO voltage is positive, current is conducted through the first diode in the diode pair. When the LO voltage is negative, current is conducted through the second diode in the diode pair.

The current-voltage (I-V) conduction characteristic of each of the diodes is nonlinear—producing currents rich in harmonics. Ideally, the I-V characteristics of the diodes are identical, the even harmonics of the current circulate within the diode loop, and the tapped mixed signal only has the odd harmonics present. The mixed signal may then be filtered to generate an IF signal.

In practice, however, the I-V characteristics of the first and second diodes in the anti-parallel diode pair are not exactly the same. The first and second diodes may for example have different saturation currents ($I_s$) or a different slope parameter ($\alpha$) due to less than exact manufacturing tolerances. Also, manufacturing tolerances may also cause the junction capacitance ($C_j$) to be different from diode to diode. This asymmetry in diode conduction characteristics and junction capacitance may result in leakage of even harmonics into the mixed signal.

Even harmonic frequency spurs in the mixed signal may be especially problematic since many down-converting (up-converting) subharmonic mixers feature an LO having a frequency of about one half the RF (IF) frequency. This produces a mixed signal having second harmonic (2LO) spur close to the RF (IF) frequency. This 2LO frequency spur is especially unwanted since it may interfere with other RF (IF) signals.

Thus, there is a need for a subharmonic mixer that is configured to suppress even harmonic frequency spurs, particularly second harmonic spurs. Stated another way, there is a need for subharmonic mixers that reduce the leakage of even harmonics into the mixed signal. Similarly, there is a need for reducing the leakage of even harmonics into the mixed signal of fundamental mixers.

SUMMARY OF THE INVENTION

In accordance with various exemplary embodiments of the present invention, a device and/or system is provided for reducing one or more frequency spurs that are output from a mixer. In an exemplary embodiment the system may comprise: a mixer in communication with an LO input, an RF matching circuit, and an IF matching circuit; and a DC bias circuit. In various exemplary embodiments, the DC bias circuit is electrically connected to provide DC bias to one or more non-linear elements of the mixer. The DC bias voltage level provided is selected to be a value that suppresses a frequency spur in the output of the mixer. In various exemplary embodiments, the non-linear elements comprise one of: BJT's, diodes, and FET's. In other exemplary embodiments, the mixer is one of: a subharmonic mixer; a fundamental resistive mixer; a fundamental subharmonic transconductance mixer; and a fundamental transconductance mixer comprising an anti-parallel diode pair. The system may further comprise: a detector configured to detect the 2LO frequency spur; a digital to analog converter (DAC) configured to convert the detected 2LO frequency spur into a digital representation of the detected 2LO frequency spur; a microcontroller configured to receive feedback from the DAC and to automatically determine an appropriate DC bias voltage level that will improve one of the LO-IF isolation and the LO-RF isolation.

An exemplary method is also provided for suppressing the 2LO frequency spur comprising the steps of: detecting the 2LO spur output of a mixer, determining the amount of DC voltage to apply to the mixer, and setting the DC bias to the determined level.

In another exemplary embodiment, a DC bias is introduced into a subharmonic mixer that features an anti-parallel diode pair or other nonlinear device pair. The DC bias circuit provides opposite DC biases to each of the diodes of the anti-parallel diode pair. The DC bias circuit voltage is adjusted (adjusts) to provide each of the diodes with a more mutually symmetric current-voltage (I-V) conduction characteristic. The DC bias circuit may also be configured to change the junction capacitance of devices to make them more similar to each other. The more symmetric I-V transfer characteristics provides for less leakage of even harmonics from a conduction loop formed by the anti-parallel diode pair. Less even harmonic leakage, particularly 2LO leakage, results in suppressed even harmonic frequency spurs, particularly the 2LO frequency spur.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

FIG. 1 and FIG. 1A show a block diagram of an exemplary subharmonic mixer according to an exemplary embodiment of the present invention;

DETAILED DESCRIPTION OF EXEMPLARY EMBODIMENTS

While exemplary embodiments are described herein in sufficient detail to enable those skilled in the art to practice the invention, it should be understood that other embodiments may be realized and that logical electrical and mechanical changes may be made without departing from the spirit and scope of the invention. Thus, the following detailed description is presented for purposes of illustration only.

Figure 1:
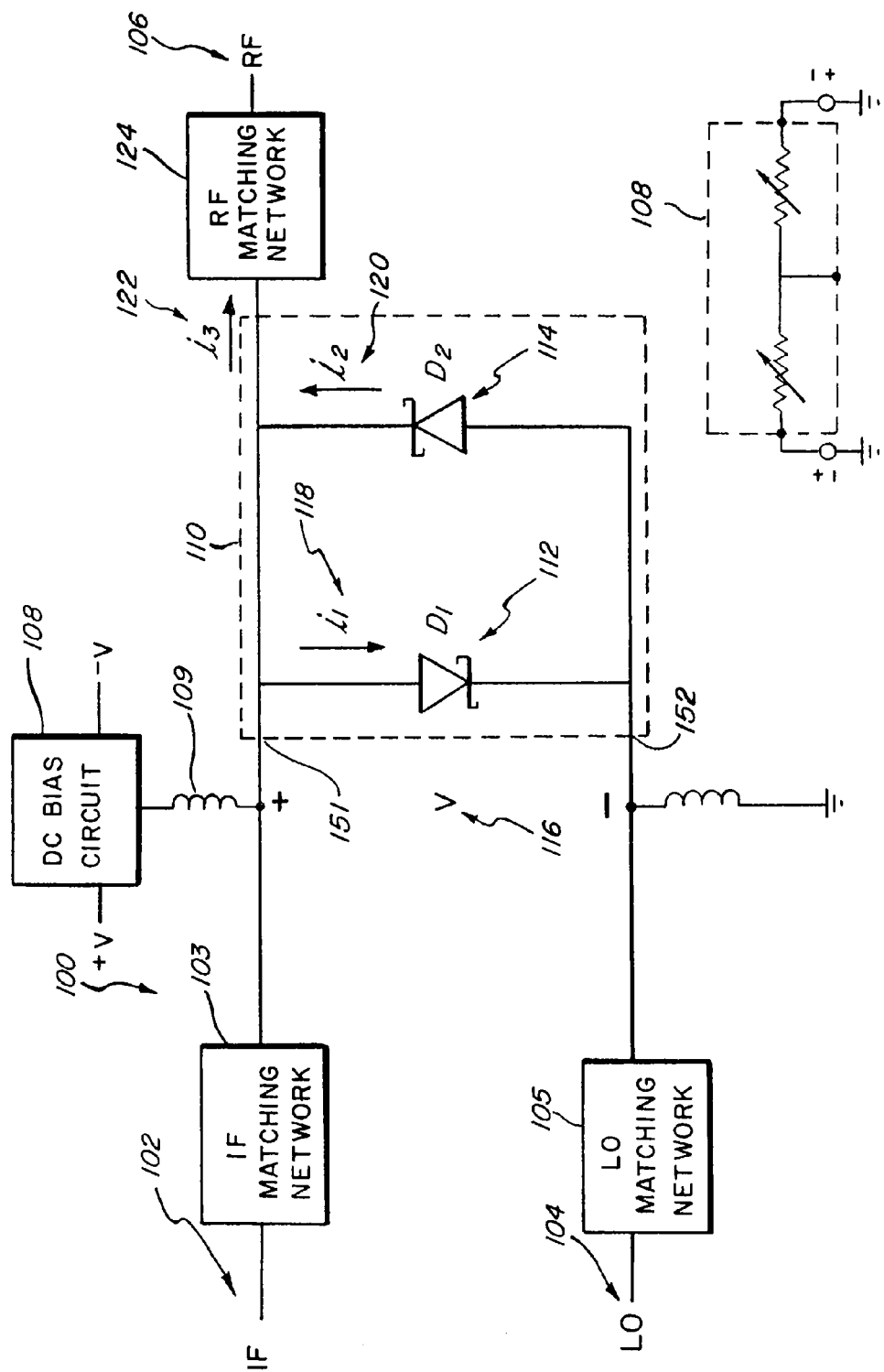

In accordance with various exemplary embodiments of the present invention, a DC bias is applied across an anti-parallel diode pair to suppress the 2LO spur and/or other even harmonics of the LO frequency. With reference now to FIG. 1. and according to an exemplary embodiment of the present invention, a up-converter subharmonic mixer 100 comprises an IF input 102, an LO input 104, an IF matching network 103, and LO matching network 105, a DC Bias circuit 108, an anti-parallel diode pair 110, an RF matching network 124, and an RF output 106. In this exemplary embodiment, IF input 102 is electrically connected through an IF matching circuit 103 to one end 151 of an anti-parallel diode pair 110. Furthermore, LO input 104 is electrically connected through LO matching network 105 to another end 152 of anti-parallel diode pair 110. The RF output 106 is electrically connected with another end 153 of the anti-parallel diode pair 110 through RF matching circuit 124. It is noted that the RF output often also includes a filter separately and/or in connection with the RF matching circuit.

In accordance with an exemplary embodiment of the present invention, the DC bias circuit 108 is connected to the anti-parallel diode pair 110. This connection may be made via, for example, an RF choke 109. In one exemplary embodiment DC bias circuit 108 is connected on the IF input path, for example at 151 as shown in FIG. 1. In another exemplary embodiment, DC bias circuit 108 is connected on the LO input path, for example at 152. Furthermore, DC bias circuit 108 could be connected on the RF output path, for example at 153. It is noted that 151 and 153 are essentially the same point. Thus, the DC bias circuit may be connected anywhere there is a DC through path to the anti-parallel diode pair 110. Furthermore, the DC bias could be connected in multiple locations if desired.

The subharmonic mixer 100 of this embodiment comprises an RF output 106 that is electrically connected with the IF input 102. In other exemplary embodiments RF output 106 may be electrically connected with the LO input 104.

In accordance with an exemplary embodiment, subharmonic mixer 100 is part of a Monolithic Microwave Integrated Circuit disposed on a gallium arsenide substrate. In accordance with other exemplary embodiments, the MMIC is on a silicon or other substrate. Furthermore subharmonic mixer 100 may be formed from discrete components disposed on a printed circuit board, disposed in a single or multiple chip module, or disposed in any other circuit equivalent.

The subharmonic mixer 100 of this exemplary embodiment comprises an anti-parallel diode pair 110 having first and second Schottky diodes 112, 114. Alternate embodiments may include other types of diodes or nonlinear circuit elements in place of Schottky diodes 112, 114.

The anti-parallel diode pair 110 comprises a first Schottky diode 112 connected with a second Schottky diode 114 in an anti-parallel configuration. The first Schottky diode's 112 anode is connected to the second Schottky diode's 114 cathode and the first Schottky diode's 112 cathode is connected the second Schottky diode's 114 anode.

With reference to FIG. 1A, an exemplary embodiment of the DC bias circuit 108 shown in FIG. 1 is described. The exemplary DC bias circuit 108 may comprise a potentiometer for adjusting the DC voltage that is supplied by DC bias circuit 108. Those skilled in the art will appreciate that there are many circuits that provide DC biasing that may be used, and that this exemplary embodiment is not the only DC bias circuit that is contemplated for the purposes described herein. Merely by way of example, DC bias circuits can be made with Bipolar Junction Transistors (BJT's), Field Effect Transistors (FET's), Operational Amplifiers (OpAmp's) and/or the like. Thus, DC bias circuit 108 may comprise any device configured to introduce a quiescent DC voltage across a non-linear device, where such DC bias balances the even harmonic frequencies and suppresses harmonic frequency spurs.

The DC bias circuit 108 is configured to bias the first Schottky diode 112 and second Schottky diode 114. Thus, DC bias circuit 108 is configured to adjust the voltage V applied across the first and second Schottky diodes. For example, a positive voltage V forward biases the first Schottky diode 112 and reverse biases the second Schottky diode 114. Similarly, a negative voltage V reverse biases the first Schottky diode 112 and forward biases the second Schottky diode 114. Thus, in accordance with an exemplary embodiment, DC bias circuit 108 may be configured to create an offset in the bias that would otherwise be provided to the first and second Schottky diodes 112, 114. The offset in the bias may be configured to cause the first and second Schottky diodes 112, 114 to more closely match their conductance characteristics (explained hereinafter).

In one exemplary embodiment, an IF signal enters the IF input 102 and an LO signal enters the LO input 104. The IF signal, the LO signal and the DC bias circuit determine the voltage (V) 116 applied to the each of the diodes in the anti-parallel diode pair 110. When V 116 is positive and greater than the first Schottky diode 112 turn on voltage, the first Schottky diode 112 conducts current $i_1$ 118. When V 116 is negative and greater than the second Schottky diode turn on voltage, the second Schottky diode 116 conducts current $i_2$ 120. The first and second Schottky diodes 112, 114 form a current loop that conducts currents $i_1$ 118 and $i_2$ 120. A current $i_3$ may flow out the current loop to RF output 106.

Schottky diodes 112, 114 have non-linear I-V conduction characteristics making $i_1$ and $i_2$ rich in harmonics. If the I-V conduction characteristics and junction capacitances ($C_j$) of the first and second Schottky diodes 112, 114 match perfectly, the even harmonics of $i_1$ 118 and $i_2$ 120 would balance and keep circulating in the current loop. This would keep the even harmonics from leaving the current loop and yield an $i_3$ substantially free of even harmonics including 2LO. In practice, however, Schottky diodes 112, 114 will have different I-V conduction characteristics and junction capacitances.

In accordance with an exemplary embodiment of the present invention, however, the conduction characteristics are adjusted and/or the junction capacitance effects are adjusted through a DC bias circuit 108. DC bias circuit 108 may be configured to bias the first and second Schottky diodes 112, 114 so that their I-V conduction characteristics are more closely matched. Closely matched Schottky diodes 112, 114 provide for more even harmonic cancelling and reducing the 2LO harmonic of $i_3$ and suppressing the 2LO frequency spur. Thus, in accordance with an exemplary embodiment, subharmonic mixer 100 is configured to shift the conductance characteristics of the Schottky diodes to more closely match each other.

One skilled in the art will recognize that the circuit of FIG. 1 is an up-convert circuit when the input to the circuit is at the IF signal port 102 and is a down-convert circuit when the input to the circuit is at the RF signal port 106. Thus, the addition of a DC bias circuit to bias an anti-parallel diode pair may be implemented in either an up-convert circuit or a down-convert circuit.

Figure 2:
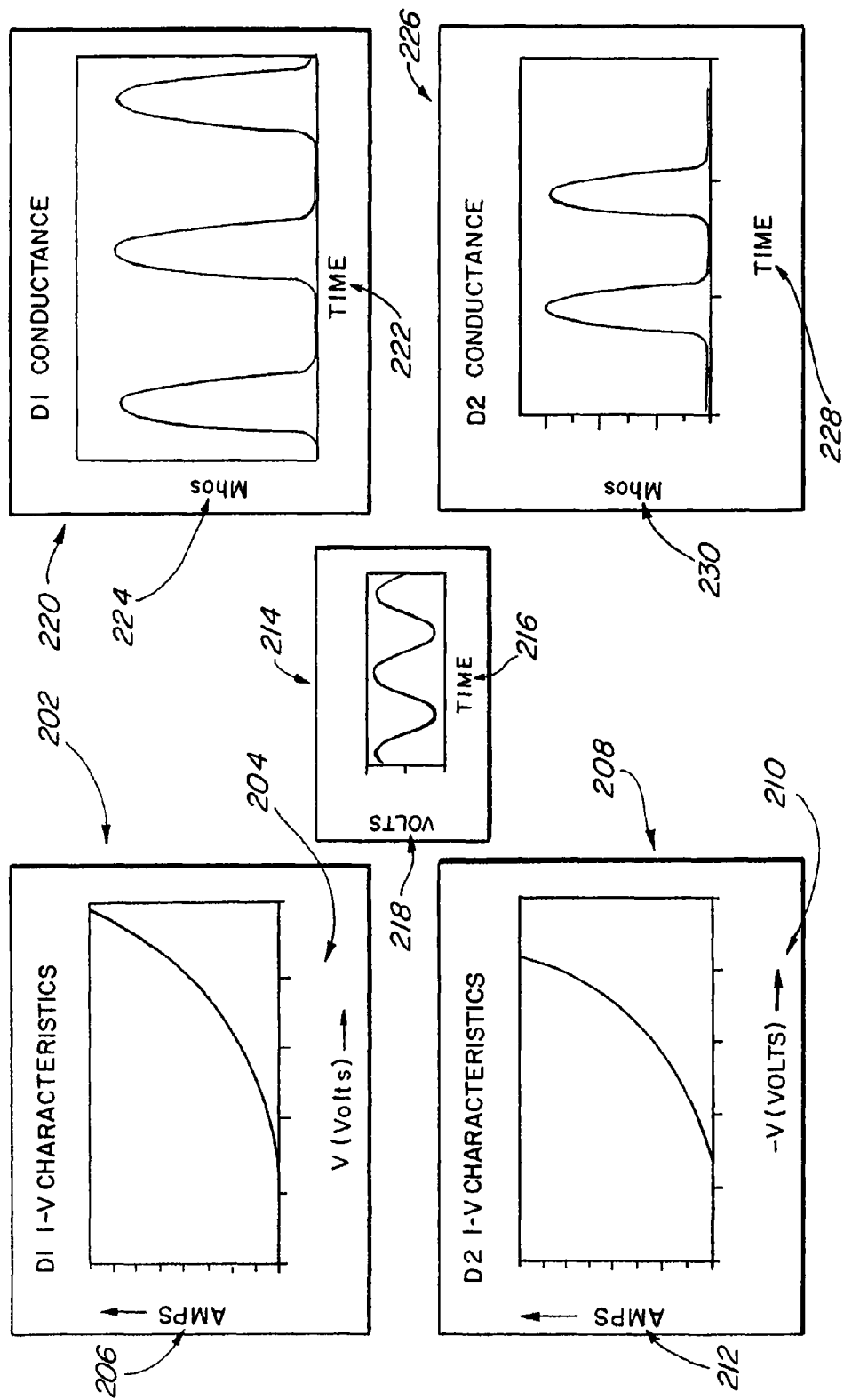
FIG. 2 shows the conduction characteristics of exemplary diodes used in the subharmonic mixer shown in FIG. 1 and in accordance with an exemplary embodiment of the present invention.

With reference now to FIG. 2, the conduction characteristics of exemplary diodes used in the subharmonic mixer shown in FIG. 1 are shown. The first plot 202 shows the I-V characteristics of the first Schottky diode (D1) as a function of voltage, V. The abscissa 204 shows the input voltage in volts and the ordinate 206 shows the current $i_1$ conducted through D1. The I-V characteristics in a Schottky barrier diode like D1 may be described by the equation:

$$I = I_s(e^{\alpha V} - 1)$$

where $I_s$ is the saturation current and $\alpha$ is the slope parameter.

The second plot 208 shows the current through the second Schottky diode (D2) as a function of negative voltage (−V). The abscissa 210 shows the input voltage in negative volts. Negative voltage notation is used here to remain consistent with the circuit topology and notation shown in FIG. 1. In FIG. 1, a negative voltage 116 is needed to forward bias diode D2 114. The ordinate of the second plot 212 shows the current $i_2$ conducted through D2. The diodes may have any suitable saturation current and slope parameter.

The third plot 214 shows an exemplary voltage signal that may be applied to D1 or D2. The abscissa 216 shows time and the ordinate 218 the voltage V. It should be understood that in this exemplary embodiment the voltage V is a function of the input signal (whether IF or RF), input LO signal, and DC Bias voltage. The voltage signal is shown here as a roughly sinusoidal voltage signal.

The fourth plot 220 shows the conductance of D1 when the sinusoid shown of the third plot 214 is applied to D1. The ordinate 222 shows time and the abscissa 224 shows conductance of D1 at that time.

Similarly the fifth plot 226 shows the conductance of D2 when the sinusoid shown of the third plot 214 is applied to D2. The ordinate 228 shows time and the abscissa 230 shows conductance of D2 at that time.

It should be noted from the first and second plots 202, 208 that the D1 and D2 I-V characteristic curves are not perfectly symmetric with respect to V. This is because the saturation currents and slope parameters of D1 and D2 are different. The D1 and D2 currents are particularly sensitive to the slope parameter $\alpha$, since the current varies exponentially as a function of $\alpha$. Variation in both saturation current and slope parameters may be expected because of less than perfect manufacturing tolerances.

D1 and D2 are non-linear devices and the conductance of the diodes varies depending on V. It should be noted from the fourth and fifth plots 220, 226 that D1 conducts current when the voltage shown in the third plot 214 is negative and D2 conducts current when the voltage shown in the third plot 214 is positive. For small voltages neither D1 nor D2 conducts current because the voltage is below both the D1 and D2 anode to cathode turn on voltages.

Figure 3:
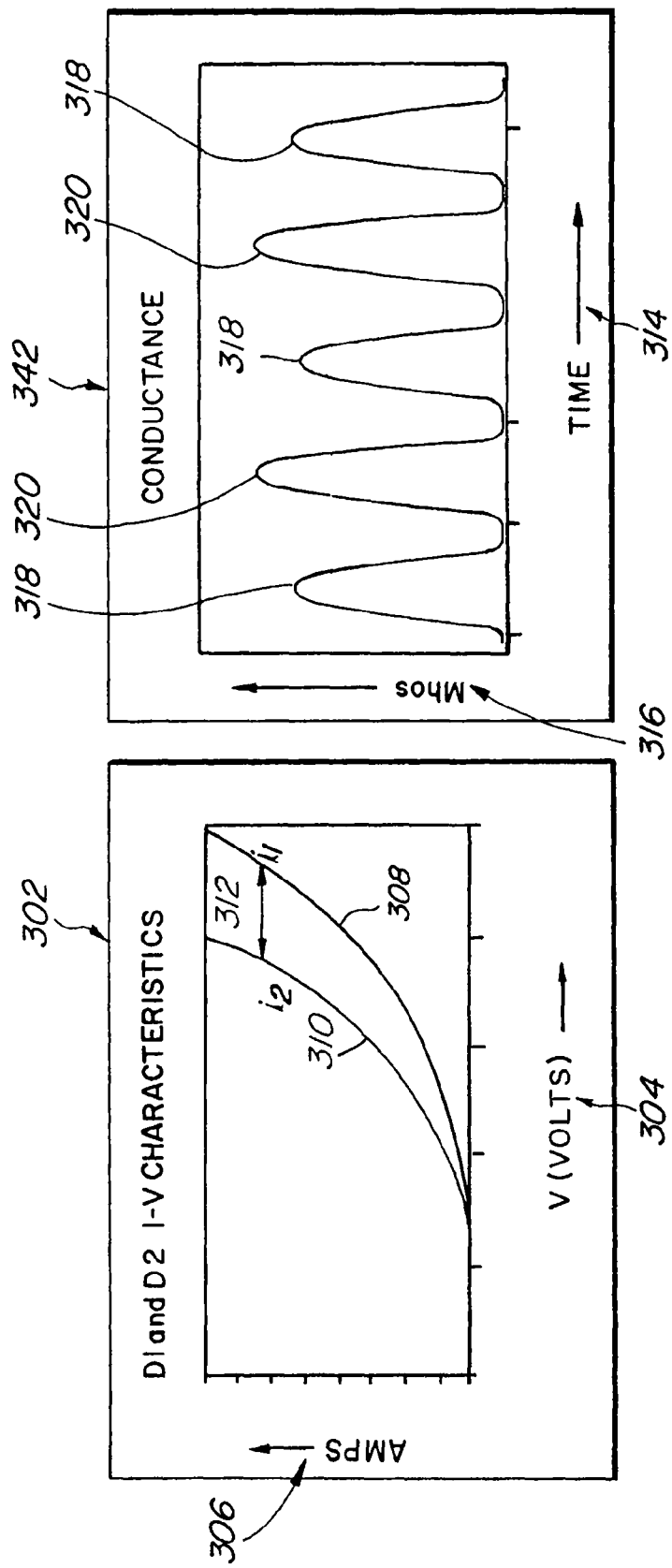
FIG. 3 shows an exemplary conductance pattern provided by the subharmonic mixer shown in FIG. 1 without the DC bias circuit providing any DC bias.

With reference now to FIG. 3, an exemplary conductance pattern provided by the subharmonic mixer shown in FIG. 1 is shown. In this case, the DC bias circuit is not providing a DC bias. The current characteristics of D1 and D2 are shown in the first plot 302. The abscissa 304 shows the anode to cathode voltage of D1 and D2. The ordinate 306 shows the $i_1$ 308 and $i_2$ 310 currents that are conducted through D1 and D2. It should be noted that the abscissa shows the anode to cathode voltage of the diodes and not the voltage V 116 shown in FIG. 1. This is because the D2 diode sense is opposite D1 and showing the anode to cathode voltage allows a more direct comparison of the I-V characteristics of each of the diodes.

The second plot 342 shows the conductance $$\left(\frac{\text{current}}{\text{voltage}}\right)$$

pattern of the anti-parallel diode pair 110 of FIG. 1 when the signal shown in the third plot 214 of FIG. 2 is applied. The abscissa 314 shows time and the ordinate 316 shows the conductance of the anti-parallel pair 110.

When the applied signal voltage is positive and the signal voltage is greater (in absolute terms) than the D1 turn on voltage, D1 conducts current as shown in the first plot 302. The anti-parallel diode pair conducts current $i_1$ 308 at those times with D1 having a conductance pattern 318. When the signal voltage is negative and the signal voltage is greater (in absolute terms) than the D2 turn on voltage, D2 conducts current $i_2$ 310 at those times with D2 having conductance pattern 320. The D1 conductance pattern 318 and the D2 conductance pattern 320 are different from each other because of differences in saturation currents and slope parameters.

In this exemplary embodiment, the conductance pattern of the anti-parallel diode consists of alternating D1 and D2 conductance patterns. The D1 conductance pattern may be different from the D2 conductance pattern in that the amplitude, width, and/or position of the curves 318, 320 are different from each other. Note, for example, that the amplitude of the D1 conductance curve 318 is smaller than the amplitude of the D2 conductance curve 320. The difference between these patterns results in less than optimal even harmonic current balancing and thus even harmonics are apparent at the output of the circuit. Notably, the 2LO harmonic, an even harmonic, is apparent.

The amplitude in these conductance patterns is generally a function of the slope characteristics. The width of a conductance sinusoid wave is generally a function of how long the diode remains on, and the position of the conductance sinusoid wave is generally a function of when the diode turns on. Thus, as DC bias is applied, these parameters are affected and tend to move the position, the width and the amplitude of these conductance patterns. This provides the ability to adjust the conductance patterns in a manner that reduces the even harmonics in the output signal of the mixer.

Figure 4:
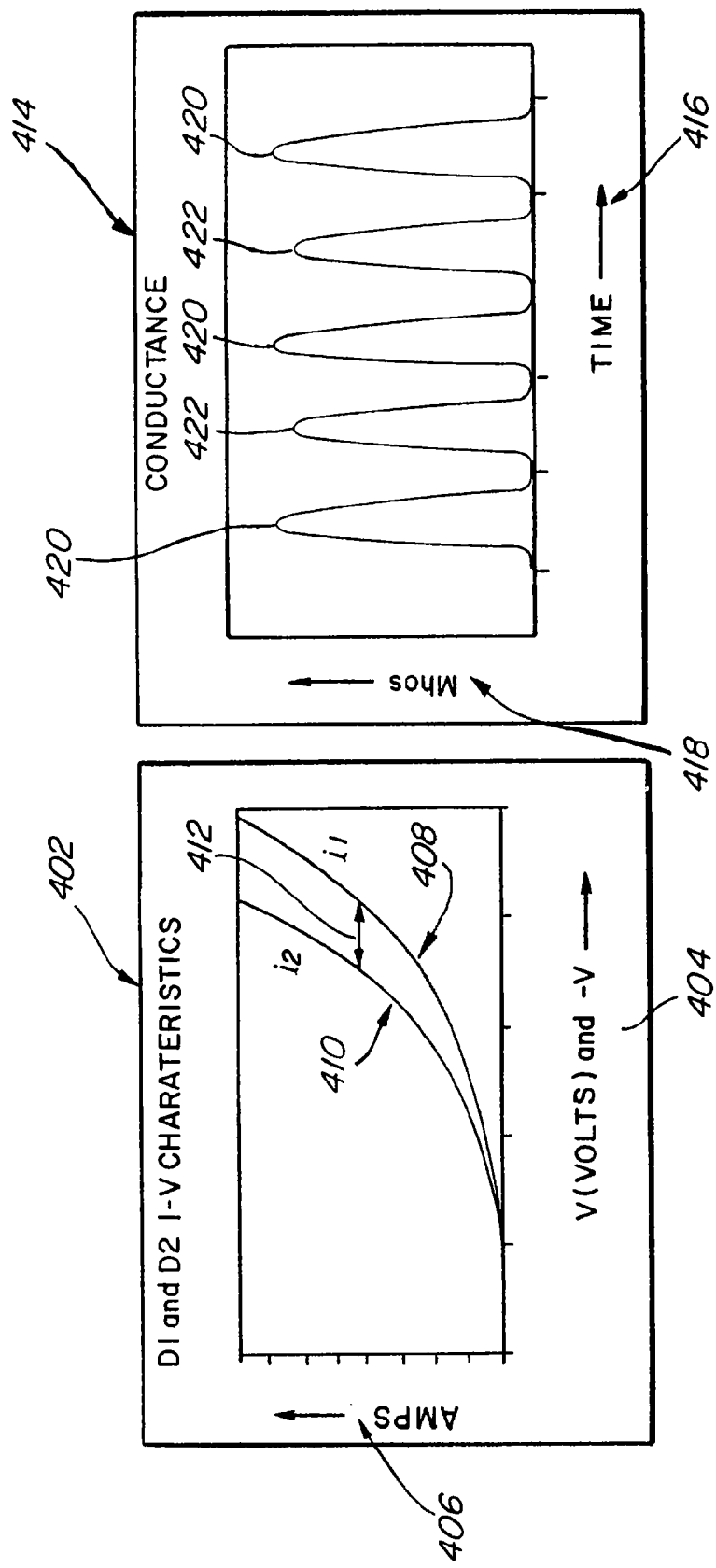
FIG. 4 shows an exemplary conductance pattern provided by the subharmonic mixer shown in FIG. 1 with the DC bias circuit providing a DC bias.

In contrast with FIG. 3, FIG. 4 shows an exemplary conductance pattern provided by the exemplary subharmonic mixer shown in FIG. 1 with the DC bias circuit 108 providing a DC bias. The first plot 402 shows the effect of DC bias circuit 108 on the anti-parallel diode pair 110 of FIG. 1. The I-V characteristics of D1 and D2 are shown in the first plot 402. The abscissa 404 shows the anode to cathode voltage of D1 and D2. The ordinate 406 shows the $i_1$ 408 and $i_2$ 410 current that are conducted through D1 and D2, respectively.

In accordance with an exemplary embodiment of the present invention, the DC bias circuit is configured to apply DC bias such that the even harmonics are reduced in $i_3$. This may be represented graphically in several ways. For example, the DC bias applied may be configured to shift the current curve of $i_1$ 408 to the left and/or the current curve of $i_2$ 410 to the right, providing the anti-parallel diode pair with more symmetric conduction characteristics. Thus, DC Bias Circuit 108 may be configured to make the gap 412 less than the gap 312 (when compared at any particular common current level), or in general to make the two I-V characteristic curves more closely resemble each other. Stated another way, subharmonic mixer 100 is configured to cause the anti-parallel diode pair 110 to have more symmetric conduction characteristics.

Similarly, applying a DC bias to the anti-parallel diode pair may, in an exemplary embodiment, change the junction capacitance $C_j$ so that the $C_j$ of one diode more closely matches the $C_j$ of the other diode. Stated another way, because $$C_j = \frac{C_{j0}}{\left(1 - \frac{V}{V_j}\right)^m},$$

adjusting the bias voltage V will adjust the junction capacitance. For example, adding DC bias may increase the $C_j$ of one diode and decrease the $C_j$ of the other diode, thus drawing the $C_j$ values closer to each other.

The second plot 414 shows the conductance pattern of the anti-parallel diode pair 110 of FIG. 1 when the signal shown in the third plot 214 of FIG. 2 is applied with compensation applied by DC bias circuit 108. The abscissa 416 shows time and the ordinate 418 shows the conductance of the anti-parallel pair 110. The conductance pattern of the anti-parallel diode pair consists of an alternating pattern of the D1 conductance pattern 420 and the D2 conductance pattern 422. The D1 conductance pattern and the D2 conductance pattern are similar to each other because the biasing circuit shifts the D1 and D2 conductance patterns such that they resemble each other more than without the biasing.

Stated another way, the amplitudes of the D1 conductance pattern 420 and D2 conductance pattern 422 may be made more similar to each other with the added biasing than without it. Similarly, as between the two conductance patterns the width of the pulses may be more similar to each other than they were without the added biasing. Similarly, the timing of the pulses of the conductance patterns may be shifted such that D1 is ready to accept the current from D2 when D2 is ready to send it. Thus, in general the conduction patterns of the diodes may be made more symmetric by the addition of bias voltage than without it. Causing the conduction patterns to be more symmetric in turn causes more of the even harmonics of current in the anti-parallel diode pair to balance and to remain in the anti-parallel diode pair. Thus, subharmonic mixer 100 is configured to suppress the 2LO spur output from the anti-parallel diode pair.

In accordance with one aspect of an exemplary embodiment of the present invention, a properly biased anti-parallel diode pair 110 not only suppresses the 2LO spur but that of every even harmonic making the device suitable for applications for suppressing any even harmonic. It should be noted that $f_{2lo}$ is often relatively close to $f_{rf}$. This makes conventional filtering of $f_{2lo}$ difficult since the filter would likely also attenuate $f_{rf}$. Driving the spur lower by tuning the anti-parallel diode pair 110 using the DC bias circuit vitiates this problem.

Figure 5:
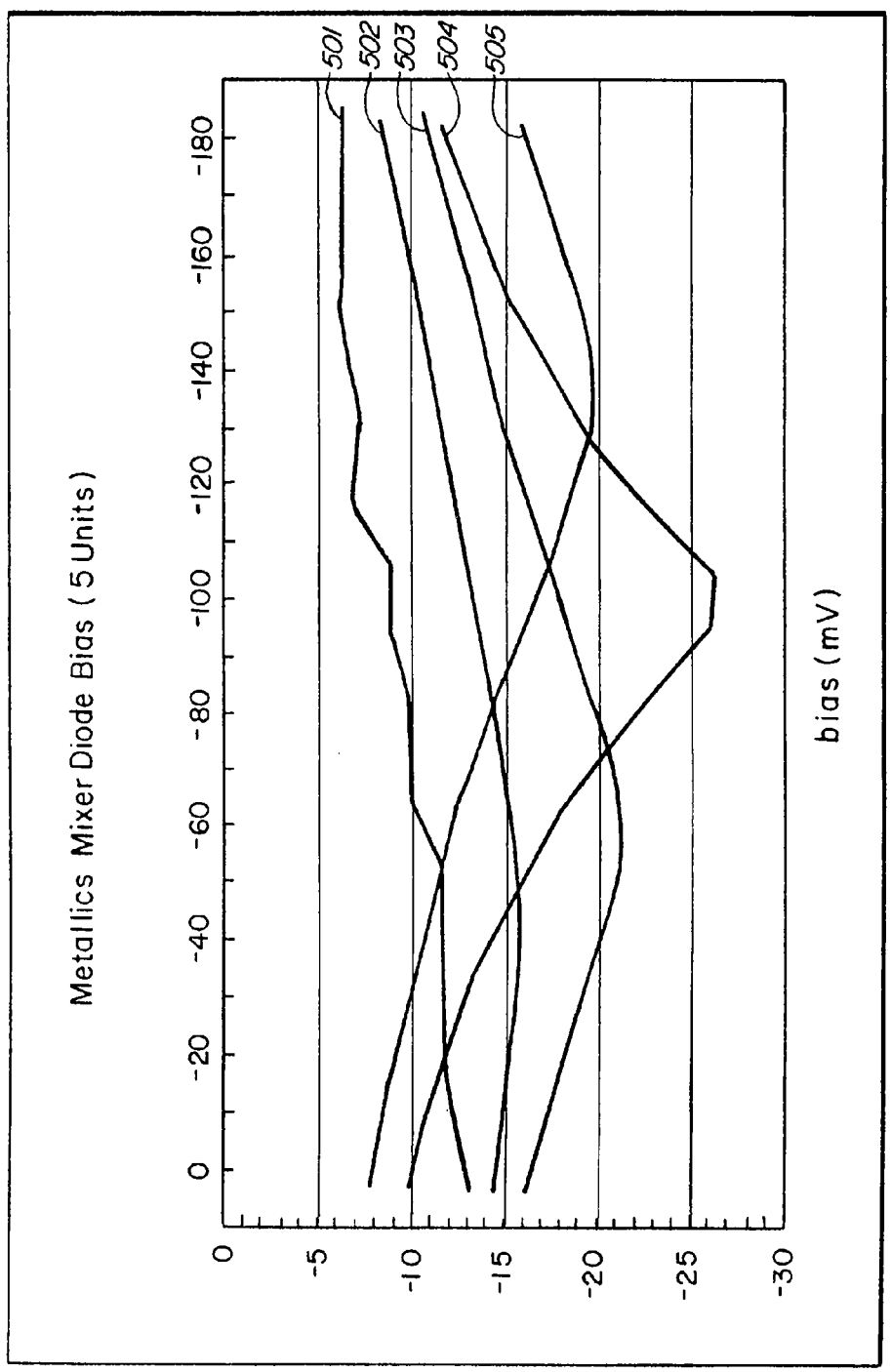
FIG. 5 illustrates exemplary 2LO detected spur levels in dBm for five exemplary mixers, and illustrates finding the optimal DC bias to apply for each such mixer in accordance with an exemplary embodiment of the present invention.

In accordance with various aspects of exemplary embodiments of the invention, and with reference to FIG. 5, the improvement in the 2LO spur level can be empirically determined by adjusting the bias voltage and recording the 2LO spur level. FIG. 5 shows several curves 501-505, in a graph 500, each curve representing a different mixer (five different mixers) where the abscissa is in mV and the ordinate is in dBm. As the dBm becomes more negative, the 2LO spur is better suppressed. It can be seen that each mixer tends to have a different bias setting for minimizing the 2LO spur. For example, the mixer associated with curve 501 likely would have a positive bias voltage as its optimal biasing point. The mixer represented by curve 502 has the best 2LO suppression around −30 to −40 mV. Likewise, curve 503 at about −50 to −70 mV, curve 504 at about −100 mV, and curve 505 at about −140 mV. One skilled in the art will recognize that any one of a number of methods may be used to identify the optimal biasing point of a particular mixer.

In accordance with various exemplary embodiments of the present invention, subharmonic mixer 100 may be configured to adjust the DC applied to the anti-parallel diode pair manually and/or automatically. For example, DC bias circuit 108 may be one of any number of DC bias circuits, now known or hereinafter invented, that are configured to provide a set, manually adjustable, or automatically adjustable DC bias voltage to a connected circuit. In one exemplary embodiment, the DC bias may be automatically adjusted to minimize the difference between the I-V characteristics of two devices and/or to minimize the $C_j$ differences between the devices.

Figure 6:
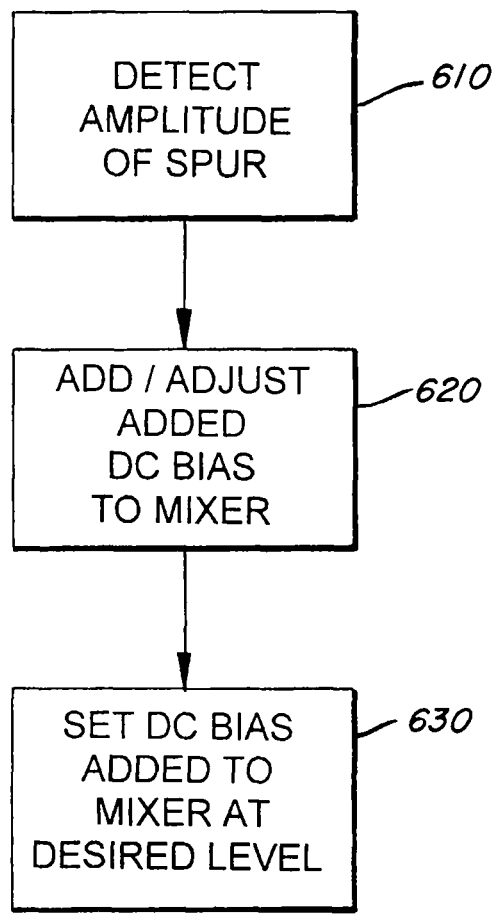
FIG. 6 shows an exemplary embodiment of a system incorporating a DC bias circuit and the subharmonic mixer in accordance with an exemplary embodiment of the present invention.

With reference now to FIG. 6, an exemplary method 600 of suppressing the 2LO frequency spur from a mixer comprises the steps of: detecting the amplitude of the spur (step 610), adding and/or adjusting the added DC bias until desired suppression of the spur is achieved (step 620), and setting the DC bias at the level used to obtain the desired suppression of the spur (step 630).

In an exemplary embodiment, the step of detecting the amplitude of the spur (step 610) may include the step of measuring the amplitude of the 2LO frequency spur. The DC bias may then be adjusted positive or negative to different magnitudes and the detecting step may be repeated. In one embodiment, the range of DC bias may be swept and the setting that best reduces the 2LO spur can be selected. In another exemplary embodiment, optimization routines may be used to efficiently identify optimal DC bias injection until optimal suppression of the 2LO frequency spur is achieved (step 620). Thus, steps 610 and 620 may include the step of determining an appropriate level of DC bias to apply to the mixer. In other exemplary embodiments, the DC bias may be set to any level that achieves a desired effect on the frequency spur(s) from the mixer.

As mentioned above, in accordance with an exemplary embodiment, the mixer is programmed to cause the DC bias to be set at the desired level, e.g., the level associated with optimal suppression of the 2LO frequency spur (step 630). In another exemplary embodiment, the DC bias is manually set. Although described herein primarily in terms of identifying and setting the DC bias one time, for example at manufacture or assembly, the invention may be useful in other embodiments. For example, in some exemplary embodiments these steps may be repeated at a later time and the DC bias set at a new level. Thus, the invention contemplates that the mixer may subsequently be reprogrammed and the DC bias set to a new level to re-optimize the suppression of the 2LO frequency spur. In another embodiment, the DC bias might be constantly or periodically being corrected.

Figure 7:
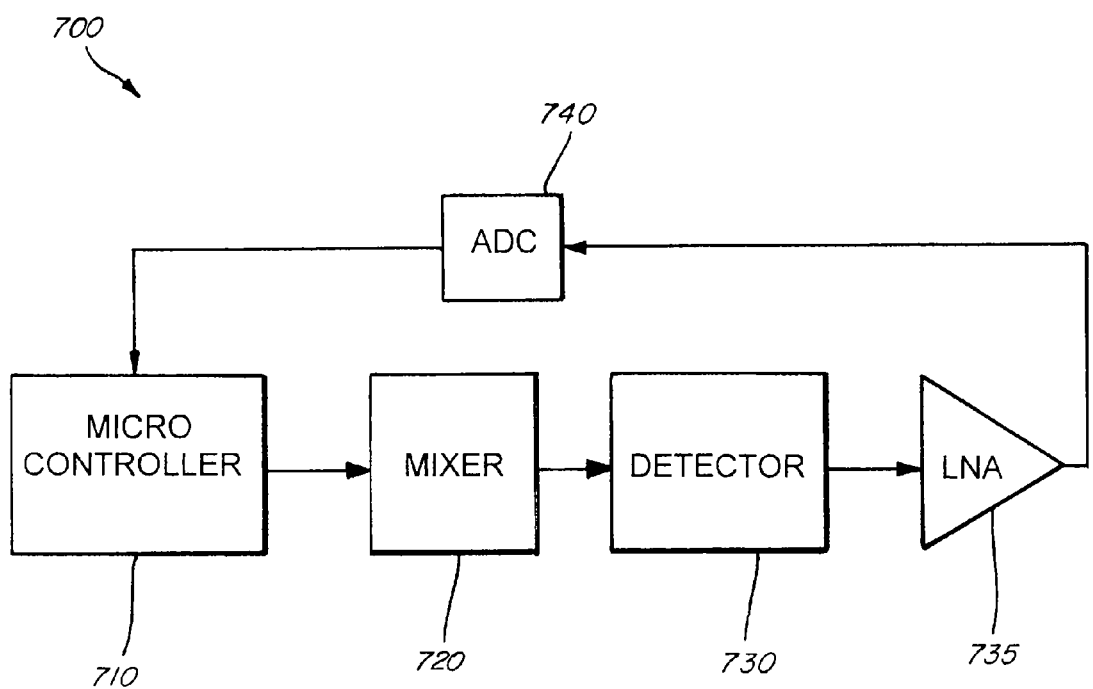
FIG. 7 is a block diagram of an exemplary method for reducing even harmonic leakage in a subharmonic mixer in accordance with an exemplary embodiment of the present invention.

In accordance with various exemplary embodiments of the present invention, a testing system may be used to implement an automated process for finding and setting an appropriate DC bias voltage that is applied to the mixer. On exemplary testing system is described herewith reference to FIG. 7. In an exemplary embodiment, a testing system 700 comprises a microcontroller 710, a mixer 720, a detector 730, a low noise amplifier 735, and an Analog to Digital Converter (ADC) 740.

Mixer 720 may output a signal which is detected by detector 730. Detector 730 may be a diode detector, a power sensor/spectrum analyzer, and/or the like. In an exemplary embodiment, detector 730 is configured to detect spurs, for example, the 2LO frequency spur. The information obtained by detector 730 may include, for example, the amplitude of one or more spurs. Detector 730 may communicate information about the spurs through low noise amplifier 735 to ADC 740. This information may be converted by ADC 740 and communicated to microcontroller 710.

Microcontroller 710 may be a computer or microcontroller configured to use this feedback to determine in an automated fashion a desired DC bias level. For example, microcontroller 710 may run through practically achievable positive and negative voltage levels of DC bias and select the one that gives the lowest spur level. Thus, microcontroller 710 may control the amount and polarity of the DC bias added to mixer 720. This feedback loop may continue until the desired level of DC bias is determined through this testing. Microcontroller 710 may be further configured to then program or set the bias level supplied to the mixer 720 at this determined amount. Other testing systems may also be used to automate the process of finding a desired DC bias voltage to be applied to the mixer.

Figure 8:
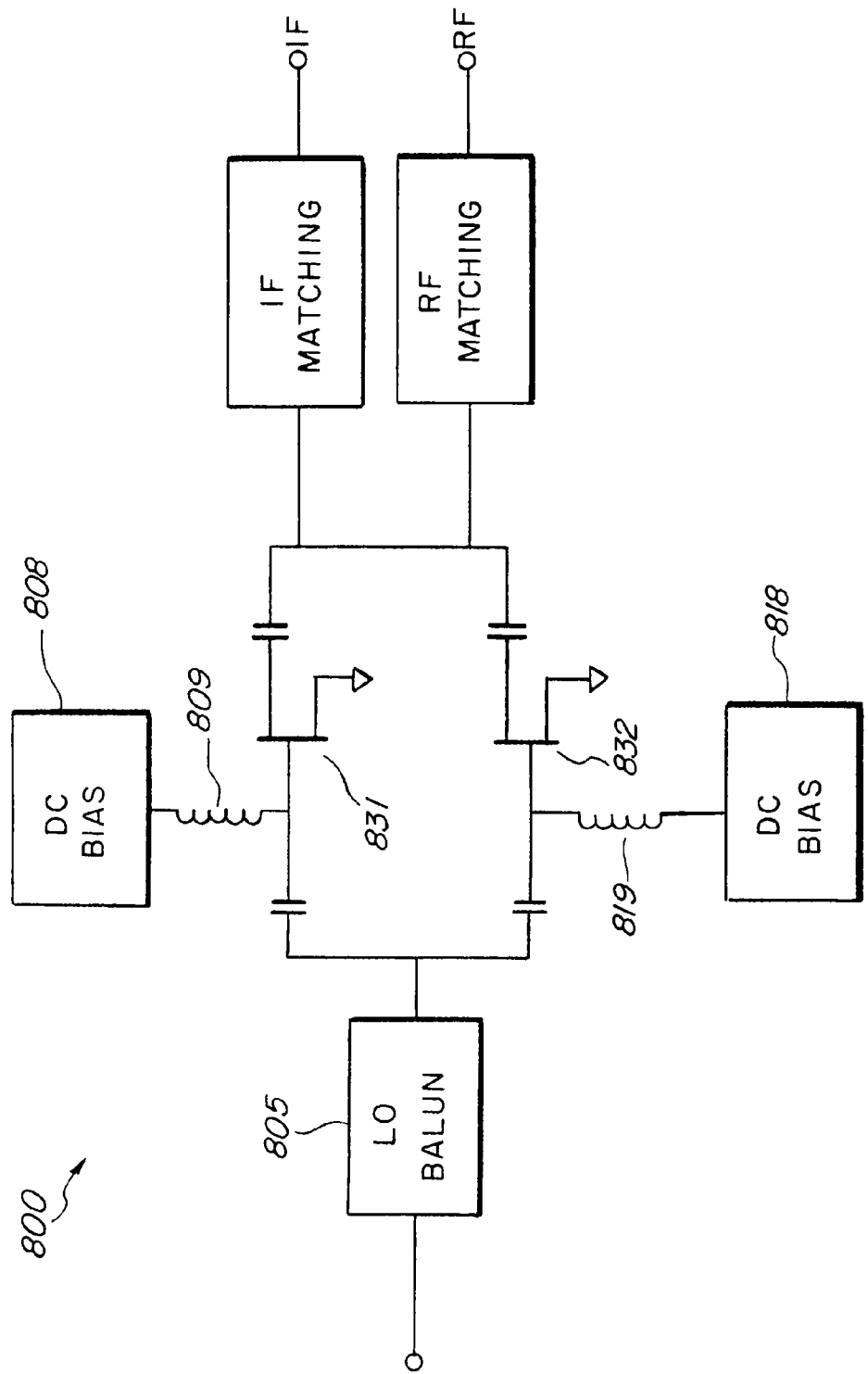
FIG. 8 shows an exemplary embodiment of a system incorporating a DC bias circuit with a FET type subharmonic mixer in accordance with an exemplary embodiment of the present invention.

Although described herein with reference primarily to an anti-parallel diode pair, the concepts discussed herein are also beneficial for other types of subharmonic mixer circuits. For example, a Field Effect Transistor (FET) subharmonic mixer may benefit from adding an appropriate amount of DC bias (i.e. DC bias tuning). Thus, in accordance with yet another exemplary embodiment, and with reference to FIG. 8, a FET subharmonic mixer 800 may comprise an LO Balun 805, IF matching circuit 803, RF matching circuit 824, DC bias circuits 808 and 818, chokes 809 and 819, and FET's 831 and 832. For example, LO Balun 805 may be electrically connected to the gate of first and second FET's 831 and 832 via capacitors. DC bias circuits 808 and 818 may also be respectively connected to the gate of FET's 831 and 832 via respective chokes 809 and 819. Thus, DC bias circuits 808 and 818 may be configured to apply a desired level of DC bias to respective FET's 831 and 832.

In this exemplary embodiment the sources of FET's 831 and 832 are electrically connected to ground and the drains are connected to each other via two capacitors in series. This forms a conduction loop similar in some aspects to the anti-parallel diode pair described elsewhere herein. The IF matching circuit 803 and RF matching circuit 824 are connected to this conduction loop between the capacitors on the collectors of the FET's. Other circuits with modified configurations but similar designs are equally contemplated, and this particular configuration is by way of example only. As is the case with respect to the anti-parallel diode pair, adding an appropriate DC bias to one or both FET's may result in keeping the even harmonics from escaping the current conduction loop, and thus may reduce frequency spurs in the output of the subharmonic mixer.

Figure 9:
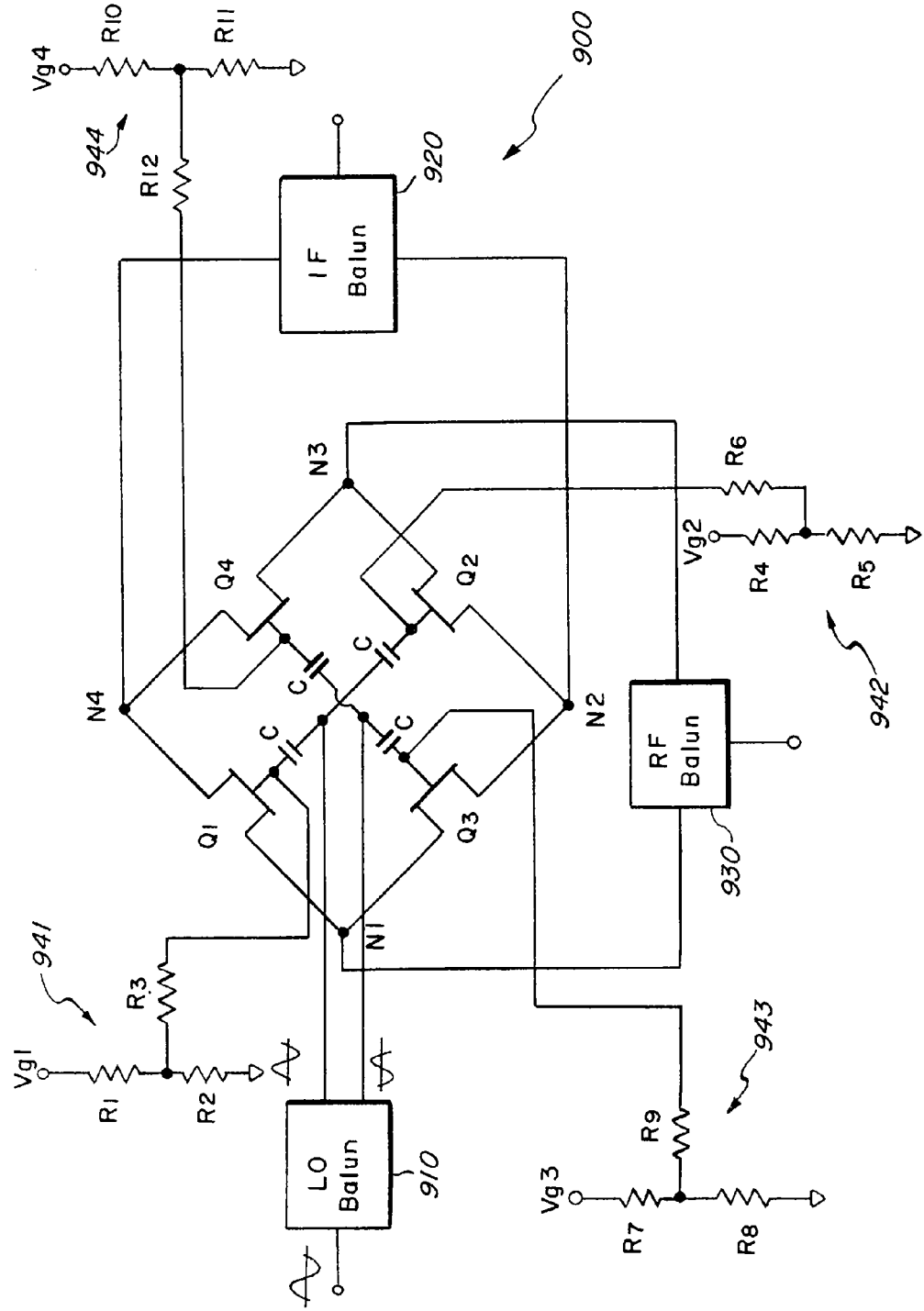
FIG. 9 shows an exemplary embodiment of a system incorporating a DC bias circuit with a fundamental FET resistive mixer in accordance with an exemplary embodiment of the present invention.

Although described herein in connection with subharmonic mixers, the concept of affecting a conductance wave form, described herein, can be extended to a fundamental mixer as well. For example, the concept may be extended to a fundamental FET resistive mixer. In accordance with an exemplary embodiment of the present invention, and with reference to FIG. 9, a fundamental FET resistive mixer 900 may comprise a LO Balun 910, an IF Balun 920, an RF Balun 930, and one or more DC bias circuit(s) 941-944.

In this exemplary embodiment, mixer 900 is a balanced mixer with FET's Q1 and Q2 conducting during the positive portion of the LO cycle and FET's Q3 and Q4 conducting during the negative portion of the LO cycle. The gates of Q1 and Q2 are electrically connected to each other through a series of blocking capacitors. Similarly the gates of Q3 and Q4 are electrically connected to each other through a series of blocking capacitors. The two outputs of LO Balun are connected respectively to the gates of the Q1/Q2 pair and Q3/Q4 pair between the respective blocking capacitors.

Due to manufacturing variations, FET parasitics such as $C_{gs}$ and $C_{gd}$ and $R_{ds}$ will not be the same as between each of the FET's. This will result in a deviation from ideal conduction characteristics. In particular, this will result in increased even or odd order spurs and a decrease in LO-RF and LO-IF isolation. In accordance with one exemplary embodiment, these performance parameters can be improved or balanced with respect to each other by applying gate bias to one or more of the FET's.

The gate bias is applied, for example, by connecting a DC bias circuit, 941-944, to the gate of the FET. In an exemplary embodiment, at least one of DC bias circuit 941-944 is connected to the gate of Q1-Q4, respectively. Q1-Q4 may all be biased at different voltage levels, Q1/Q2 can be biased at the same voltage levels and Q3/Q4 can be biased at the same voltage level different from the Q1/Q2 biasing, or all the FET's could be biased at the same voltage level. Moreover, it will be appreciated that this biasing may be implemented with one or more bias circuits 941-944. Although described herein with a separate bias circuit for each FET, in some embodiments, a single voltage source Vg1 could supply bias to all the FET's. In such an embodiment, voltage divider circuits or the like can cause differential biasing between the FET's.

Although various DC bias circuits may be used, in on exemplary embodiment, DC bias circuits 941-944 comprise a voltage source with, for example, a voltage divider configuration that is configured to facilitate adjusting the voltage level that is supplied to the FET. Thus, DC bias can be added at a desired level to the FET(s) of mixer 900 to reduce frequency spurs in the output of the mixer and improve the RF and 2LO isolation.

In accordance with other exemplary embodiments, this concept can also be applied to any mixers comprising non-linear elements such as, BJT's, diodes, FET's, and/or the like. Moreover, this concept may, in other exemplary embodiments, be applied to mixers such as: a subharmonic mixer; a fundamental resistive mixer; a fundamental subharmonic transconductance mixer; and a fundamental transconductance mixer. In some transconductance mixers both gate and drain DC bias may be varied. In accordance with various exemplary embodiments, the mixer may be incorporated in a transceiver.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

What is claimed is:

1. A system for suppressing frequency spurs, comprising:
   a mixer comprising:
      an anti-parallel diode pair; and
      a bias circuit connected in parallel with the anti-parallel diode pair for applying a direct current (DC) bias to the anti-parallel diode pair;
   a detector coupled to the mixer, said detector configured to detect an amplitude of a frequency spur of an output of the mixer;
   an analog-to-digital converter (ADC) coupled to an output of the detector, wherein the ADC converts the detected amplitude of the frequency spur to a digital signal; and
   microcontroller coupled to an output of the ADC, wherein the microcontroller uses the digital signal from the ADC to iteratively adjust the DC bias applied by the bias circuit to reduce the amplitude of the frequency spur.

2. The system of claim 1, wherein the mixer is a subharmonic mixer.

3. The system of claim 2, wherein the anti-parallel diode pair comprises two Schottky diodes.

4. The system of claim 2 wherein the anti-parallel diode pair is disposed on a gallium arsenide substrate, and wherein the anti-parallel diode pair and the bias circuit are part of a monolithic microwave integrated circuit.

5. The system of claim 2, further comprising, a local oscillator connected with a first end of the anti-parallel diode pair.

6. A transceiver comprising the system of claim 2.

7. The system of claim 1, wherein the mixer is one of:
   a subharmonic mixer;
   a fundamental resistive mixer;
   a fundamental subharmonic transconductance mixer; and
   a fundamental transconductance mixer comprising an anti-parallel diode pair.

8. A system for suppressing frequency spurs, comprising:
   a mixer comprising;
      a first diode having a first anode and a first cathode;
      a second diode having a second anode connected with the first cathode and a second cathode connected with the first anode; and
      a bias circuit connected with the first anode and second cathode for biasing the first and second diodes;
   a detector coupled to the mixer, said detector configured to detect an amplitude of a frequency spur of an output of the mixer;
   an analog-to-digital converter (ADC) coupled to an output of the detector, wherein the ADC converts the detected amplitude of the frequency spur to a digital signal; and
   a microcontroller coupled to an output of the ADC wherein the microcontroller uses the digital signal from the ADC to iteratively adjust a direct current (DC) bias applied by the bias circuit to reduce the amplitude of the frequency spur.

9. The system of claim 8, wherein the mixer is a suhharmonic mixer.

10. The system of claim 9, wherein the bias circuit provides a DC voltage across the first and second diodes for approximately matching the first diode conductance characteristics with the second diode conductance characteristics.

11. The system of claim 9, wherein the first and second diodes are Schottky diodes.

12. The system of claim 8, wherein the mixer is one of:
   subharmonic mixer;
   a fundamental resistive mixer;
   a fundamental subharmonic transconductance mixer; and
   a fundamental transconductance mixer comprising an anti-parallel diode pair.

13. A method for suppressing a frequency spur of a subharmonic mixer, the method comprising:
   detecting an amplitude of a second harmonic (2LO) frequency spur in an output of a subharmonic mixer;

converting the detected amplitude of the 2LO frequency spur to a digital signal and feeding the digital signal back to a microcontroller;

determining, by the microcontroller, a direct current (DC) bias voltage level to supply to a non-linear device of the subharmonic mixer;

programming, by the microcontroller, to supply the DC bias voltage level to the non-linear device of the subharmonie mixer.

14. The method of claim 13, wherein the subharmonic mixer comprises an antiparallel diode pair.

15. The method of claim 13, wherein the subharmonic mixer comprises at least one of BJTs, diodes, and FETs.

16. The method of claim 13, wherein the amount of DC bias is selected to improve one of the LO-IF isolation and the LO-RF isolation.

17. The method of claim 13 further comprising adjusting the DC bias to cause the non-linear device in the subharmonic mixer to have more similar conduction characteristics to other non-linear devices in the subharmonic mixer.

18. A system for reducing one or more frequency spurs that are output from a subharmonic mixer, the system comprising:

a subharmonic mixer in communication with a local oscillator (LO) input, a radio frequency (RF) matching circuit, and an intermediate frequency (IF) matching circuit;

a direct current (DC) bias circuit coupled to a non-linear element in the subharmonic mixer, wherein the DC bias circuit supplies a DC bias voltage to the non-linear element, and wherein the DC bias suppresses a frequency spur in an output of the subharmonic mixer;

a detector coupled to the subharmonic mixer, said detector configured to detect an amplitude of the frequency spur of the output of the subharmonic mixer;

an analog-to-digital converter (ADC) coupled to an output of the detector, wherein the ADC converts the detected amplitude of the frequency spur to a digital signal; and a microcontroller coupled to an output of the ADC, wherein the microcontroller uses the digital signal from the ADC to iteratively adjust a direct current (DC) bias applied by the DC bias circuit to suppress the frequency spur.

19. The system of claim 18, wherein the non-linear element comprises one of: BJTs, diodes, and FETs.

* * * * *

UNITED STATES PATENT AND TRADEMARK OFFICE
CERTIFICATE OF CORRECTION

PATENT NO.         : 8,559,905 B2
APPLICATION NO.    : 11/950831
DATED              : October 15, 2013
INVENTOR(S)        : Kenneth V. Buer et al.

It is certified that error appears in the above-identified patent and that said Letters Patent is hereby corrected as shown below:

In the Claims:

In Column 12, line 7, "a" before the word "microcontroller" is excluded in error and should be added.

In Column 12, line 29, the ":" after the word "comprising" is excluded in error and should be added in the place of the ";" that was included in error.

In Column 12, lines 47 and 48, "subharmonic" before the word "mixer" is excluded in error and should be added in the place of the "suhharmonic" that was included in error.

In Column 13, lines 8 and 9, "subharmonic" before the word "mixer" is excluded in error and should be added in the place of the "suhharmonic" that was included in error.

In Column 14, line 14, the space " " before the word "wherein" is excluded in error and should be added.

Signed and Sealed this
Seventeenth Day of December, 2013

Margaret A. Focarino
*Commissioner for Patents of the United States Patent and Trademark Office*